United States Patent
Darmawan et al.

(10) Patent No.: US 8,269,659 B2
(45) Date of Patent: Sep. 18, 2012

(54) SYSTEM AND METHOD FOR COMPACT CYCLIC DIGITAL TO ANALOG CONVERTER

(75) Inventors: Yoseph Adhi Darmawan, Singapore (SG); Yannick Guedon, Singapore (SG)

(73) Assignee: STMicroelectronics Asia Pacific Pte., Ltd., Singapore (SG)

( * ) Notice: Subject to any disclaimer, the term of this patent is extended or adjusted under 35 U.S.C. 154(b) by 19 days.

(21) Appl. No.: 12/925,222

(22) Filed: Oct. 15, 2010

(65) Prior Publication Data

US 2012/0092201 A1    Apr. 19, 2012

(51) Int. Cl.
*H03M 1/78* (2006.01)
(52) U.S. Cl. ......... 341/154; 341/136; 341/144; 341/145
(58) Field of Classification Search .................. 341/136, 341/144, 145, 154
See application file for complete search history.

(56) References Cited

U.S. PATENT DOCUMENTS

| 5,495,245 | A | * | 2/1996 | Ashe ............................. 341/145 |
| 5,943,000 | A | * | 8/1999 | Nessi et al. .................... 341/154 |
| 5,999,115 | A | * | 12/1999 | Connell et al. ................ 341/145 |
| 6,570,520 | B2 | * | 5/2003 | Ishii ............................. 341/144 |
| 7,589,653 | B2 | * | 9/2009 | Guedon et al. ................ 341/144 |

* cited by examiner

*Primary Examiner* — Khai M Nguyen

(57) ABSTRACT

A system for implementing a cyclic digital to analog converter (c-DAC) is capable of supporting a large size liquid crystal display. The system includes an upper DAC stage configured to output a first voltage between a lower voltage supply (HVDD) and an upper voltage supply (AVDD). The system also includes a lower DAC stage configured to output a second voltage between the lower voltage supply (HVDD) and a ground. The upper DAC stage includes a single PMOS switch and the lower DAC stage includes a single NMOS switch.

20 Claims, 4 Drawing Sheets

SYSTEM AND METHOD FOR COMPACT CYCLIC DIGITAL TO ANALOG CONVERTER

TECHNICAL FIELD

The present application relates generally to digital to analog conversion and, more specifically, to a system and method for cyclic digital-to-analog conversion for use with large sized liquid crystal displays.

BACKGROUND

Digital-to-analog converter (DAC) circuitry converts digital signals into analog signals for use by additional circuitry. Many devices can include DAC circuitry such as video components. Video signals from a digital source, such as a computer, are converted to analog form if they are to be displayed on an analog monitor. DACs are also incorporated in Liquid Crystal Display (LCD) column drivers.

Single rail LCD column drivers utilize a supply voltage (AVDD) as the main supply. Dual rail LCD column drivers may commonly use shield circuits (shields) to assure that the output transistors do not exceed a specified maximum voltage.

SUMMARY

A digital-to-analog (DAC) circuit is provided. The DAC circuit includes an upper voltage supply and a middle voltage supply. The DAC circuit also includes an upper DAC stage. The upper DAC stage includes an upper DAC switch circuit. The upper DAC switch circuit consists of a first set of transistors. A body of the first set transistors are coupled to the upper voltage supply, and a drain and source of the first set of transistors is configured to receive any voltage between the middle voltage supply and the upper voltage supply. The DAC circuit also includes a lower DAC stage. The lower DAC stage includes a lower DAC switch circuit. The lower DAC switch circuit consists of a second set of transistors. A body of the second set of transistors is coupled to a ground and a drain and source is configured to receive any voltage between the lower voltage supply and the middle voltage supply.

A digital-to-analog (DAC) circuit capable of operating over an upper range and a lower range is provided. The DAC circuit includes an upper voltage supply, a middle voltage supply, and a lower voltage node. The upper range is a first voltage between the middle voltage supply and the upper voltage supply, and the lower range is a second voltage between the lower voltage node and the middle voltage supply. The DAC circuit also includes an upper DAC stage. The upper DAC stage includes an upper DAC switch circuit. The upper DAC switch circuit consists of a first set of transistors. A body of the first set of transistors is coupled to the upper voltage supply, and a drain and source of the first set of transistors is configured to receive any voltage between the middle voltage supply and the upper voltage supply. The DAC circuit also includes a lower DAC stage. The lower DAC stage includes a lower DAC switch circuit. The lower DAC switch circuit consists of a second set of transistors. A body of the second transistor is coupled to the lower voltage node, and a drain and source of the second set of transistors is configured to receive any voltage between the lower voltage supply and the middle voltage supply.

A digital-to-analog (DAC) circuit capable of operating over an upper range and a middle range is provided. The DAC circuit includes an upper voltage supply, a middle voltage supply, a lower voltage node, and an upper DAC stage. The upper DAC stage includes an upper DAC switch circuit. The upper DAC switch circuit consists of a first set of transistors. A body of the first set transistors is coupled to the upper voltage supply, and a drain and source of the first set of transistors is configured to receive any voltage between the middle voltage supply and the upper voltage supply. The DAC circuit also includes a lower DAC stage. The lower DAC stage includes a lower DAC switch circuit. The lower DAC switch circuit consists of a second set of transistors. A body of the second set of transistors is coupled to the lower voltage node, and a drain and source of the first set of transistors is configured to receive any voltage between the lower voltage supply and the middle voltage supply. The DAC circuit also includes an upper output switch configured to switch an upper output node of the upper DAC stage to an output node when the output is in the upper range, and a lower output switch configured to switch a lower output node of the lower DAC stage to the output node when the output is in the lower range.

Before undertaking the DETAILED DESCRIPTION OF THE INVENTION below, it may be advantageous to set forth definitions of certain words and phrases used throughout this patent document: the terms "include" and "comprise,"as well as derivatives thereof, mean inclusion without limitation; the term "or," is inclusive, meaning and/or; the phrases "associated with" and "associated therewith,"as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system.

Figure 1:
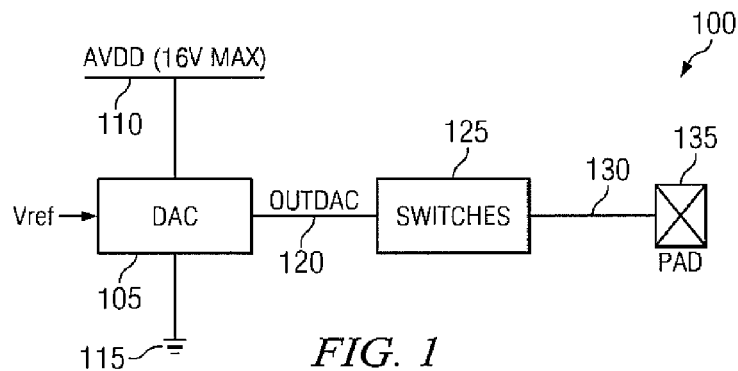
FIG. 1 illustrates a single rail LCD driver circuit.
Figure 2A:
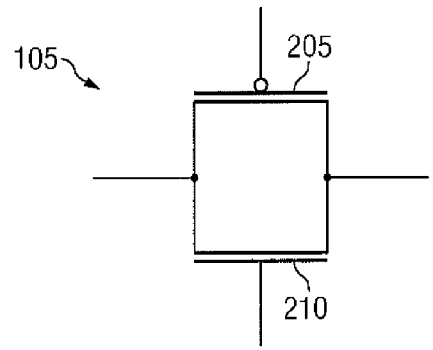
FIG. 2A illustrates a complementary switch structure according to embodiments of the present disclosure.

FIG. 1 illustrates a conventional single rail LCD driver circuit. The LCD driver circuit 100 includes a DAC 105 coupled between a supply voltage (hereinafter "AVDD") 110 and ground 115. AVDD 110 can be a sixteen volt (16V) maximum supply.

Figure 2B:
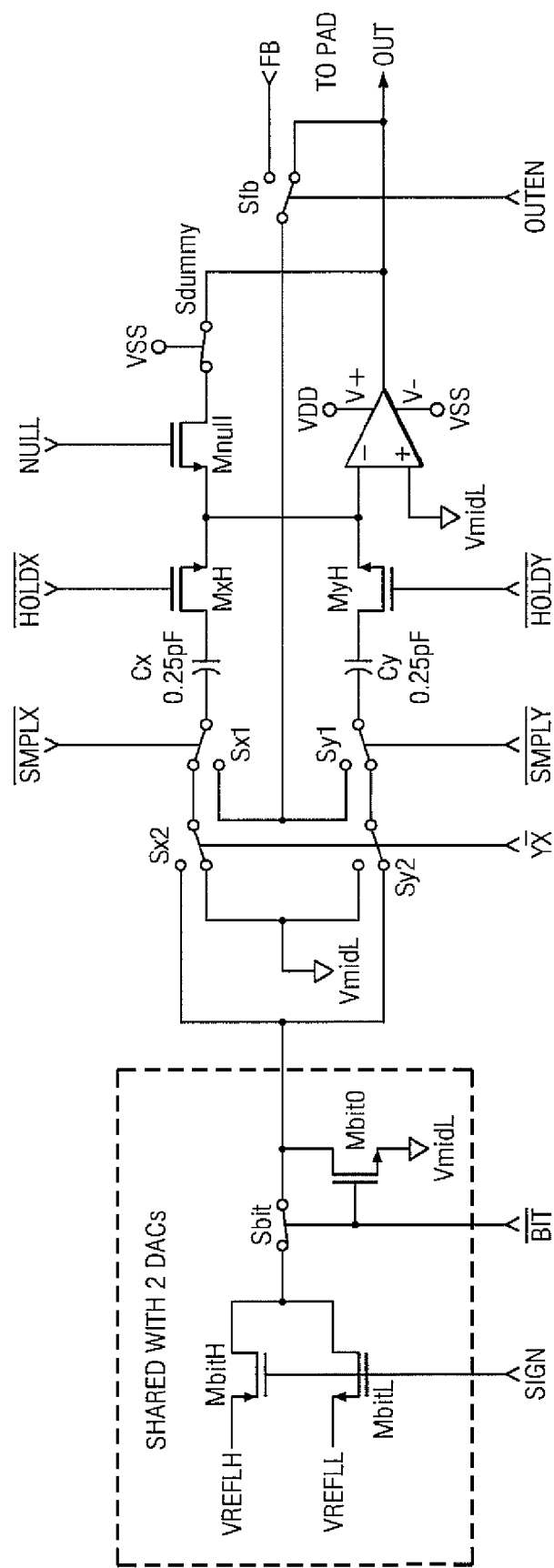
FIG. 2B illustrates a circuit architecture including complementary switches in which some of the complementary switches are shared with 2 DACs.

In the example shown in FIG. 1, the DAC 105 receives Vrefs in a range from zero volts (0V) to AVDD. The DAC 105 includes one or more 16V compliance transistors. The configuration of the DAC 105 is further illustrated in greater detail in FIG. 2A, in which the DAC 10 includes switches in a complementary structure, that is, p-channel MOSFET (PMOS) transistor 205 and n-channel MOSFET (NMOS) transistor 210 switches are used together as a pair. In addition, the example shown in FIG. 2B illustrates a circuit architecture including complementary switches wherein some of the complementary switches may be shared with two DACs as described below. The internal switches 205, 210 are in a complementary pair structure because the Vrefs can have any value between 0V and AVDD. Although not shown in FIG. 2B, the body of NMOS transistor 210 can be coupled to the ground (0V) 115 and the body of the PMOS transistor 205 can be coupled to AVDD 110.

The DAC 105 outputs a signal (OUTDAC). The output is taken at 120 as shown. The OUTDAC signal is output from the DAC 105 to a number of switches 125 to produce switch outputs 130. The switches 125 include one or more 16V compliance transistors in a complementary structure, that is, PMOS and NMOS switches used together as a pair. The PAD 135 has an output voltage swing between 0 and AVDD, which in this example is 16 volts.

Figure 3:
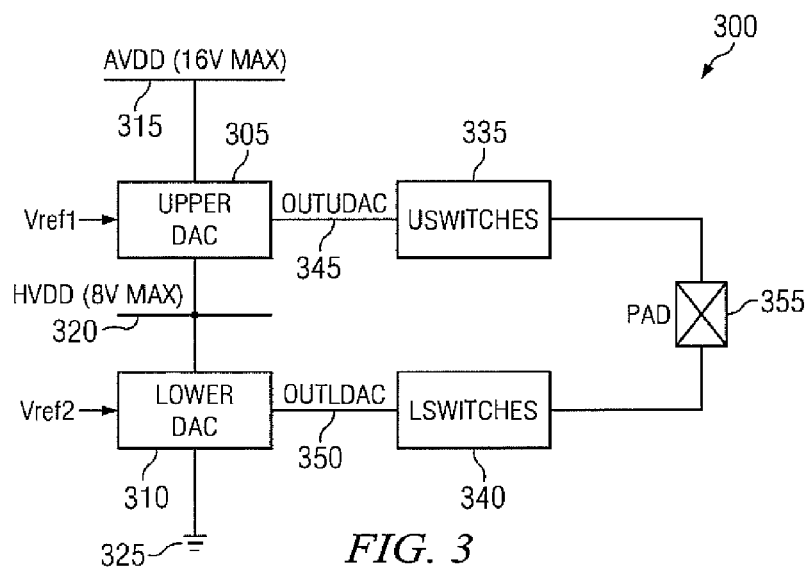
FIG. 3 illustrates a dual rail LCD driver circuit according to the present disclosure.

FIG. 3 illustrates a dual rail LCD driver circuit according to the present disclosure. The embodiment of the dual rail LCD driver circuit 300 is for illustration only. Other embodiments could be used without departing from the scope of this disclosure. In some embodiments, the LCD driver circuit 300 is configured as a LCD driver circuit disclosed in U.S. Pat. No. 7,589,653 to Guedon et al. entitled "OUTPUT ARCHITECTURE FOR LCD PANEL COLUMN DRIVER", issued on Sep. 15, 2009, the contents of which are hereby incorporated by reference in their entirety.

The LCD driver circuit 300 includes an upper DAC (UDAC) 305 and a lower DAC (LDAC) 310. LCD driver circuit 300 includes two supply voltages, AVDD 315 and HVDD 320. The HVDD 320 can be an eight volt (8V) supply while the AVDD 315 can be a sixteen volt (16V) maximum supply, that is, AVDD 315 can be twice HVDD 320.

The UDAC 305 is coupled between AVDD 315 and HVDD 320. The LDAC 310 is coupled between HVDD 320 and ground 325 (0V). The UDAC 305 is coupled on an output to Upper switches (USwitches) 335 while LDAC 310 is coupled on an output to lower switches (LSwitches) 340. The USwitches 335 and LSwitches 340 can be complementary MOS transistor switches. Therefore, the LCD driver circuit 300 includes an upper section and a lower section. Upper refers to an upper range which normally operates between HVDD-AVDD, and lower refers to a lower range which normally operates between 0-HVDD.

The dual rail LCD driver circuit 300 uses HVDD 320 and AVDD 315 as the main supply. The OUTUDAC 345 swings from HVDD to AVDD while the OUTLDAC 350 swings from 0V to HVDD. The PAD 355 swings from 0V to AVDD.

Figure 4:
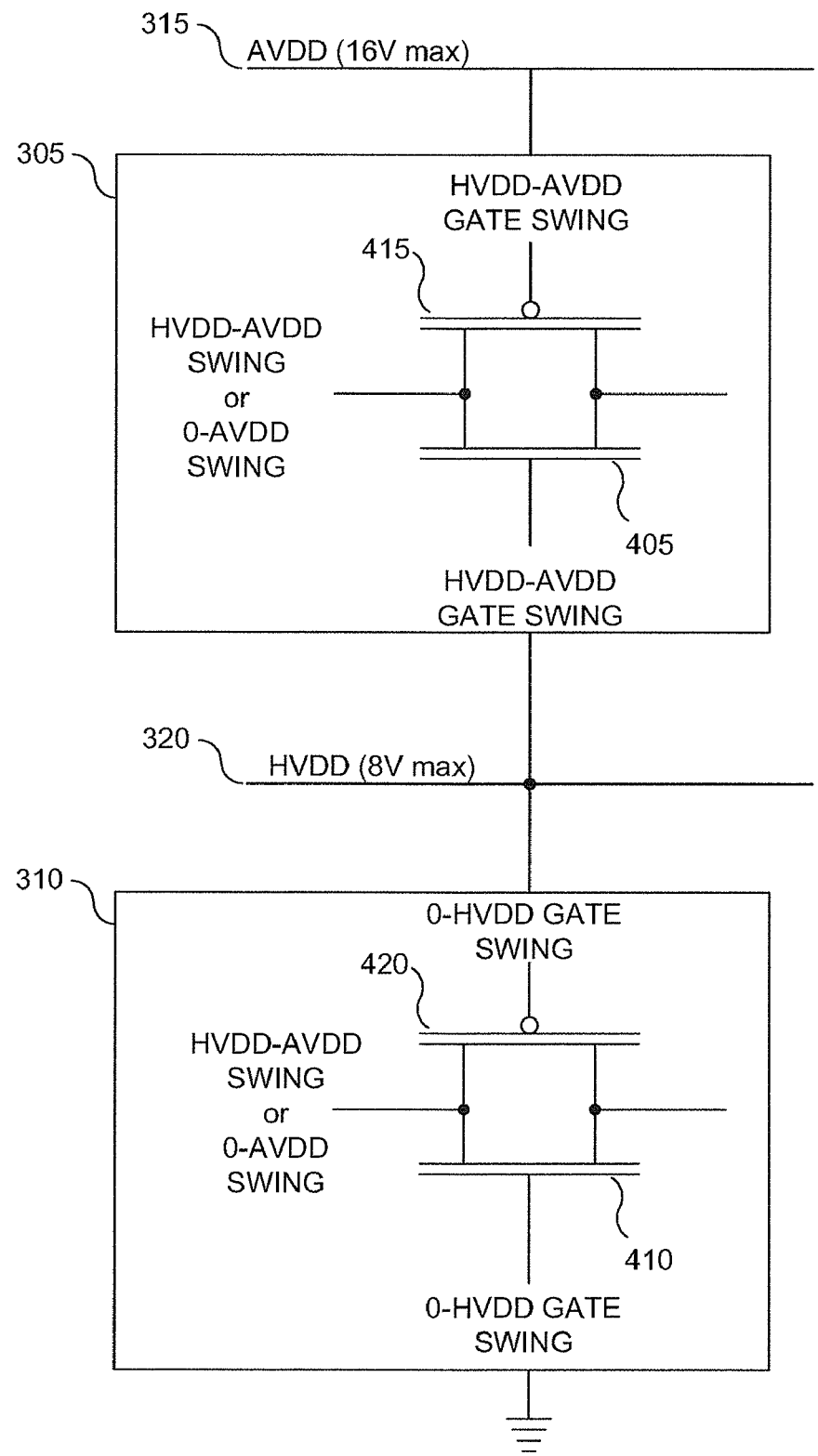
FIG. 4 illustrates complementary switch structure in upper and lower DACs according to embodiments of the present disclosure.

In some embodiments, the UDAC 305 and the LDAC 310 are manufactured using larger 16 volt compliance transistor. In this example, the OUTUDAC 345 and OUTLDAC 350 can each tolerate voltage swings from O-AVDD swing due to use of the 16V compliance transistors in the UDAC 305 and the LDAC 310. In order to avoid turning on the intrinsic diodes of the transistors, the body of the NMOS transistors 405 and 410 in FIG. 4 are both coupled to the ground (0V) for both the upper and the lower DACs 305, 310 while the body of the PMOS transistors 415 and 420 are coupled to the AVDD for both the upper and the lower DACs 305, 310.

In this embodiment, the size is potentially impacted due to the use of the larger 16 volt compliance transistors 405-420. This could have impact on the body effect (becoming higher). Therefore bigger transistors are needed to achieve the same performance. The body effect and the process constraint result in comparatively large transistor size which will affect the speed performance of the DAC 305, 310.

In the example shown in FIG. 3, the UDAC 305 and the LDAC 310 can be manufactured using eight volt (8V) compliance transistors and sixteen volt (16V) transistors as output switches 335, 340. The 16 volt compliance transistors are configured as shown in FIG. 4. In this example, the OUTUDAC 345 can tolerate a Vref range that is an HVDD-AVDD swing and the OUTLDAC 350 can tolerate a Vref range that is an 0-HVDD swing due to use of the 8V compliance transistors in UDAC 305 and the LDAC 310.

The single rail LCD driver 100 architecture uses only one supply voltage (AVDD 110). The dual rail LCD driver circuit 300 architecture makes use of two supply voltages (AVDD 315 and HVDD 320). The dual rail LCD driver circuit 300 provides the possibility to stack the DAC into upper and lower sections. By using an appropriate structure, the upper and lower DAC sections could utilize medium voltage compliance transistors, that is, 8V compliance, due to the smaller voltage requirement. The medium voltage compliant transistor has a smaller size and will result in fast DAC speed and smaller die area.

The area of the DAC can be a critical factor in designing a column driver. A smaller DAC area can result in a smaller die size because the number of outputs in the column driver is proportional to the number of DAC used. For example, a 420 output column driver consists of an upper DAC and a lower DAC.

Figure 5:
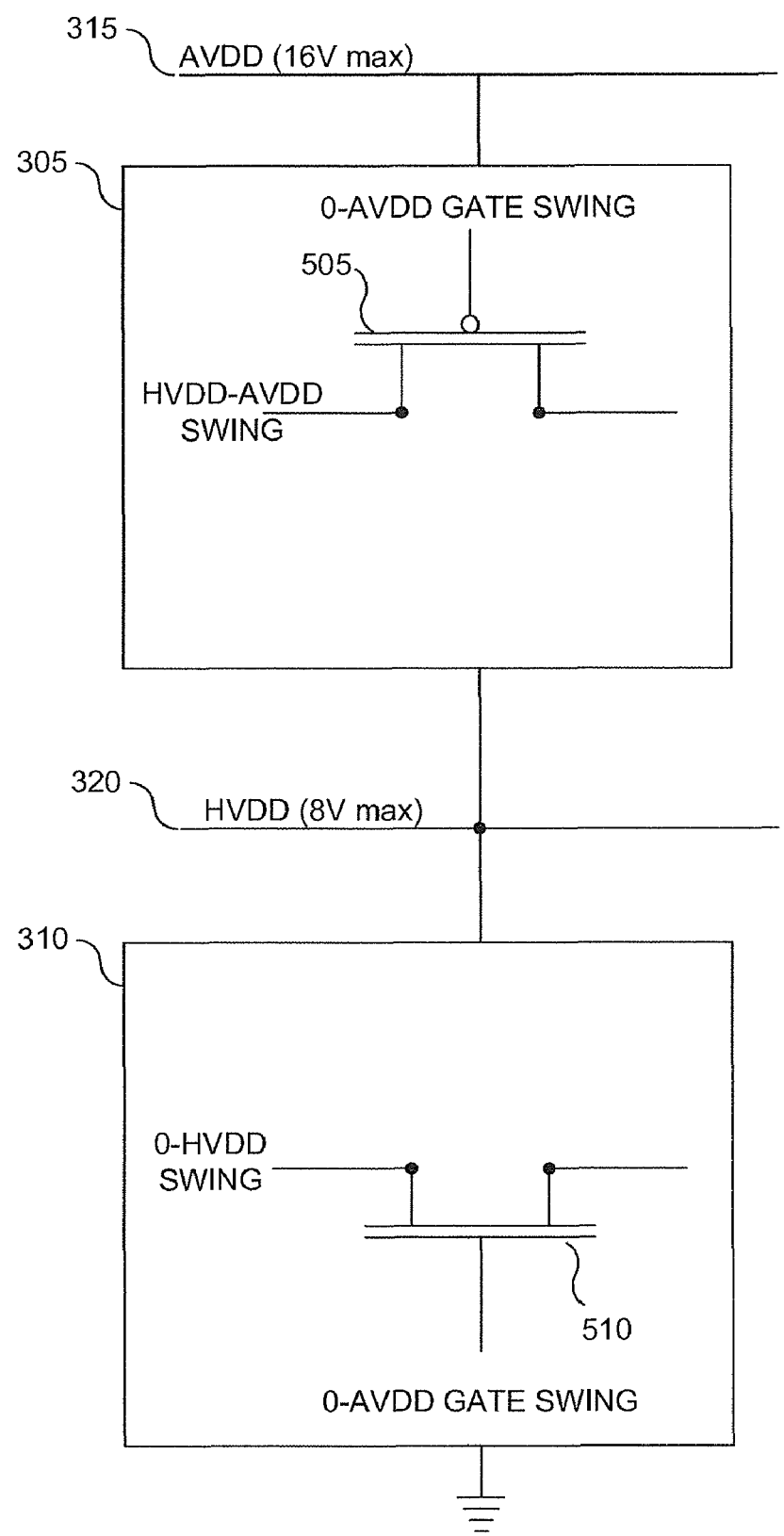
FIG. 5 illustrates upper and lower DACs according to embodiments of the present disclosure.

FIG. 5 illustrates upper and lower DACs according to embodiments of the present disclosure. The embodiment of the upper and lower DACs shown in FIG. 5 is for illustration only. Other embodiments could be used without departing from the scope of this disclosure.

In some embodiments, to further reduce the area of the DAC, a smaller number of transistors are used in the dual rail LCD driver circuit 300 architecture. The dual rail LCD driver circuit 300 can include single type of MOS switches in the UDAC 305 and the LDAC 310. For example, the UDAC 305 can include a single type of MOS switch (PMOS) 505 and the LDAC 310 can include a single type of MOS switch (NMOS) 510.

The symmetric 8V transistors, in a 16V process, can sustain up to 16V between the gate/source and gate/drain. The CMOS switches in the UDAC 305 can be replaced by a single PMOS switch having a gate swinging from 0 to AVDD, and the CMOS switches in the LDAC 310 can be replaced by a single NMOS switch having a gate swinging from 0 to AVDD.

The PMOS switch 505 can be an 8V transistor with a 16V gate compliance. In addition, the drain or source voltage of the UDAC 305 can be within the HVDD-AVDD range. The NMOS switch 510 also can be an 8V transistor with a 16V gate compliance. Further, the drain or source voltage of the LDAC 310 can be within the 0-HVDD range. Therefore, the minimum Gate-Source voltage (Vgs) of the PMOS switch 505 is HVDD when it is on, which is the same as the minimum Vgs of the NMOS switch 510.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A digital-to-analog (DAC) circuit, the DAC circuit comprising:
    an upper voltage supply;
    a middle voltage supply;
    and a ground node configured to couple to a ground;
    an upper DAC stage comprising an upper DAC switch circuit, the upper DAC switch circuit consisting of a first set of transistors, wherein a body of the first set of transistors is coupled to the upper voltage supply and a drain and source of the first set of transistors is configured to receive a voltage in a range between the middle voltage supply and the upper voltage supply; and
    a lower DAC stage comprising a lower DAC switch circuit, the lower DAC switch circuit consisting of a second set of transistors, wherein a body of the second set of transistors is coupled to the ground node and a drain and source of the second set of transistors is configured to receive a second voltage in a range between the ground node and the middle voltage supply.

2. The DAC circuit according to claim 1, wherein the first set of transistors is a set of p-channel MOSFET (PMOS) transistors.

3. The DAC circuit according to claim 1, wherein the second set of transistors is a set of n-channel MOSFET (NMOS) transistors.

4. The DAC circuit according to claim 1, further comprising an upper output switch configured to switch an upper output node of the upper DAC stage to an output node when an output is in the upper range, and a lower output switch configured to switch a lower output node of the lower DAC stage to the output node when the output is in the lower range.

5. The DAC circuit according to claim 4, wherein the upper output switch and the lower output switch comprise MOS transistor switches.

6. The DAC circuit according to claim 1, wherein the first and second transistors each operate with a gate swing from 0 volts to the upper supply voltage.

7. The DAC circuit according to claim 1, wherein the first set of transistors and the second set of transistors comprise 8 volt transistors.

8. A digital-to-analog (DAC) circuit capable of operating over an upper range and a lower range, the DAC circuit comprising:
    an upper voltage supply;
    a middle voltage supply;
    a lower voltage node, wherein the upper range comprises a first voltage range between the middle voltage supply and the upper voltage supply and the lower range comprises a second voltage range between the lower voltage node and the middle voltage supply;
    an upper DAC stage comprising an upper DAC switch circuit, the upper DAC switch circuit consisting of a first transistor, wherein a body of the first transistor is coupled to the upper voltage supply and a drain and a source of the first transistor are configured to receive a first voltage value in the first voltage range; and
    a lower DAC stage comprising a lower DAC switch circuit, the lower DAC switch circuit consisting of a second transistor, wherein a source and a body of the second transistor are coupled to the lower voltage node and a drain and the source of the second transistor are configured to receive a second voltage value in the second voltage range.

9. The DAC circuit according to claim 8, wherein the first transistor is a PMOS transistor and the second transistor is an set NMOS transistor.

10. The DAC circuit according to claim 8, wherein a minimum gate to source voltage of the first transistor is at the middle supply voltage when the first transistor is on and a minimum gate to source voltage of the second transistor is at the middle supply voltage when the second transistor is on.

11. The DAC circuit according to claim 8, further comprising an upper output switch configured to switch an upper output node of the upper DAC stage to an output node when an output is in the upper range, and a lower output switch configured to switch a lower output node of the lower DAC stage to the output node when the output is in the lower range.

12. The DAC circuit according to claim 11, wherein the upper output switch and the lower output switch comprise MOS transistor switches.

13. The DAC circuit according to claim 12, wherein the MOS transistor switches in each of the upper output switch and the lower output switch comprise complementary pairs of switches.

14. The DAC circuit according to claim 8, wherein the first and second transistors comprise 8 volt transistors that operate with a gate swing from 0 volts to the upper supply voltage.

15. A digital-to-analog (DAC) circuit capable of operating over an upper range and a lower range, the DAC circuit comprising:
    an upper voltage supply;
    a middle voltage supply;
    a lower voltage node;
    an upper DAC stage comprising an upper DAC switch circuit, the upper DAC switch circuit consisting of a first transistor, wherein a body of the first transistor is coupled to the upper voltage supply and a drain and a source of the first transistor are configured to receive a first voltage value in a range between the middle voltage supply and the upper voltage supply;
    a lower DAC stage comprising a lower DAC switch circuit, the lower DAC switch circuit consisting of a second transistor, wherein a source and a body of the second transistor are coupled to the lower voltage node and a drain and the source of the second transistor are configured to receive a second voltage value in the second voltage range;
    an upper output switch configured to switch an upper output node of the upper DAC stage to an output node when an output is in the upper range; and
    a lower output switch configured to switch a lower output node of the lower DAC stage to the output node when the output is in the lower range.

16. The DAC circuit according to claim 15, wherein the first transistor is PMOS transistor and the second transistor is an NMOS transistor.

17. The DAC circuit according to claim 15, wherein the upper output switch and the lower output switch comprise MOS transistor switches.

18. The DAC circuit according to claim 17, wherein the MOS transistor switches in each of the upper output switch and the lower output switch comprise complementary pairs of switches.

19. The DAC circuit according to claim 15, wherein the first and second transistors comprise 8 volt transistors that operate with a gate swing from 0 volts to the upper supply voltage.

20. The DAC circuit according to claim 15, wherein a minimum gate to source voltage of the first transistor matches a minimum gate to source voltage of the second transistor and wherein the gate to source voltage of each transistor is at the middle supply voltage when the respective transistor is on.

* * * * *